US011162981B2

(12) United States Patent
Yam et al.

(10) Patent No.: US 11,162,981 B2
(45) Date of Patent: Nov. 2, 2021

(54) MAGNETIC FIELD TRANSDUCER MOUNTING METHODS FOR MTJ DEVICE TESTERS

(71) Applicant: Integrated Silicon Solution, (Cayman) Inc., Grand Cayman (KY)

(72) Inventors: Danny Yam, Fremont, CA (US); Jorge Vasquez, Fremont, CA (US); Georg Wolf, Fremont, CA (US); Roberto Cordero, Fremont, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 38 days.

(21) Appl. No.: 16/777,755

(22) Filed: Jan. 30, 2020

(65) Prior Publication Data

US 2020/0166544 A1 May 28, 2020

Related U.S. Application Data

(62) Division of application No. 15/855,757, filed on Dec. 27, 2017, now Pat. No. 10,684,310.

(51) Int. Cl.
| | | |
|---|---|---|
| *G01R 31/00* | (2006.01) | |
| *G01R 1/16* | (2006.01) | |
| *G01R 31/28* | (2006.01) | |
| *G11C 29/00* | (2006.01) | |
| *G11C 29/56* | (2006.01) | |
| *G01R 31/26* | (2020.01) | |

(52) U.S. Cl.
CPC .............. *G01R 1/16* (2013.01); *G01R 31/002* (2013.01); *G01R 31/2621* (2013.01); *G01R 31/2831* (2013.01); *G01R 31/2834* (2013.01); *G01R 31/2851* (2013.01); *G11C 29/00* (2013.01); *G11C 29/006* (2013.01); *G11C 29/56016* (2013.01); *H01L 2224/48091* (2013.01); *H01L 2224/48145* (2013.01); *H01L 2924/00* (2013.01); *H01L 2924/0002* (2013.01)

(58) Field of Classification Search
CPC ......... H01L 2924/0002; H01L 2924/00; H01L 2224/48091; H01L 2224/48145; G01R 31/2834; G01R 31/2851; G01R 31/002; G01R 31/2621; G01R 1/16; G01R 31/2831; G11C 29/006; G11C 29/00; G11C 29/56016
USPC ......... 324/71, 378, 403, 415, 425, 500, 537, 324/750.01

See application file for complete search history.

(56) References Cited

U.S. PATENT DOCUMENTS

| 2002/0074997 | A1* | 6/2002 | Smith, Jr. | G01D 11/245 324/252 |
| 2017/0059669 | A1* | 3/2017 | Kan | G01R 33/1207 |
| 2019/0195944 | A1* | 6/2019 | Yam | G11C 29/56016 |

* cited by examiner

*Primary Examiner* — Raul J Rios Russo

(57) ABSTRACT

A magnetic field transducer mounting apparatus can include a first mount configured to fixedly couple to a side surface of a wafer test fixture magnet, and a second and third mount configured to adjustably position a magnetic field transducer in a predetermined location proximate a face of the wafer test fixture magnet.

10 Claims, 6 Drawing Sheets

CALIBRATION

610 — MEASURING A SET OF ONE OR MORE MAGNETIC FIELDS GENERATED BY A WAFER TEST FIXTURE MAGNET USING A FIRST MAGNETIC FIELD TRANSDUCER POSITIONED, BY A MAGNETIC FIELD TRANSDUCER MOUNTING APPARATUS, IN A PREDETERMINED LOCATION ADJACENT A FACE OF THE WAFER TEST FIXTURE MAGNET

620 — MEASURING THE SET OF ONE OR MORE MAGNETIC FIELDS GENERATED BY THE WAFER TEST FIXTURE MAGNET AT A SECOND MAGNETIC FIELD TRANSDUCER POSITIONED PROXIMATE A WAFER CHUCK WHERE A MTJ DEVICE IS LOCATED DURING TESTING

630 — CORRELATING THE SET OF ONE OR MORE MAGNETIC FIELDS MEASURED AT THE FACE OF THE WAFER TEST FIXTURE MAGNET TO THE SET OF ONE OR MORE MAGNETIC FIELDS MEASURED AT THE WAFER CHUCK

TESTING

640 — MEASURING A MAGNETIC FIELD GENERATED BY A WAFER TEST FIXTURE MAGNET USING THE FIRST MAGNETIC FIELD TRANSDUCER POSITIONED, BY THE MAGNETIC FIELD TRANSDUCER MOUNTING APPARATUS, IN THE PREDETERMINED LOCATION ADJACENT THE FACE OF THE WAFER TEST FIXTURE MAGNET

650 — CONTROLLING THE MAGNETIC FIELD GENERATED BY THE WAFER TEST FIXTURE MAGNET AT A PREDETERMINED LOCATION ON A WAFER BASED ON THE MEASUREMENT OF THE MAGNETIC FIELD AT THE FIRST MAGNETIC FIELD TRANSDUCER AND THE CORRELATION BETWEEN THE SET OF ONE OR MORE MAGNETIC FIELDS MEASURED AT THE FACE OF THE WAFER TEST FIXTURE MAGNET AND AT THE WAFER CHUCK

Figure 6

MAGNETIC FIELD TRANSDUCER MOUNTING METHODS FOR MTJ DEVICE TESTERS

CROSS-REFERENCE TO RELATED APPLICATIONS

This is a Divisional of U.S. patent application Ser. No. 15/855,757 filed Dec. 27, 2017, which is incorporated herein in its entirety.

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, game consoles, smart phones, servers, and the like have facilitated increased productivity and reduced costs in communicating and analyzing data in most areas of entertainment, education, business, and science. One common aspect of computing systems is the memory subsystem that is used to store data. Computing systems may include one or more types of memory, such as volatile random-access memory, non-volatile flash memory, and the like.

An emerging non-volatile memory technology is Magnetoresistive Random Access Memory (MRAM). In MRAM devices, data can be stored in the magnetization orientation between ferromagnetic layers. Typically, if the ferromagnetic layers have the same magnetization polarization, the cell will exhibit a relatively low resistance value corresponding to a '1' bit state; while if the magnetization polarization between the two ferromagnetic layers is antiparallel the memory cell will exhibit a relatively high resistance value corresponding to a '0' bit state. Because the data is stored in the magnetic fields, MRAM devices are non-volatile memory devices. MRAM devices are characterized by densities similar to Dynamic Random-Access Memory (DRAM), power consumption similar to flash memory, and speed similar to Static Random-Access Memory (SRAM).

MRAM devices typically employ an array of Magnetic Tunnel Junctions (MTJs). The MTJs can include two ferromagnetic layers separate by a thin insulator layer. Electrons can tunnel from one ferromagnetic layer into the other. However, the orientation of the magnetization on the ferromagnetic layers affects the rate of electron tunneling such that the junction can be switched between a low resistance state and a high resistance state.

When testing MTJ devices, a magnet can be placed over a wafer to induce a magnetic field in the MTJ devices. The applied magnetic field can be used to test features of the MTJ device. For accurately testing the MTJ devices, it may be necessary to accurately control the magnetic field produced by the magnet. As MTJ devices continue to be scaled, there is a continuing need to control the magnetic field with greater accuracy. Similarly, there may be a continuing need to improve control of the magnetic field for such purposes and characterizing performance of the individual dies on a wafer, to perform failure mode analysis, yield analyses, and the like.

SUMMARY OF THE INVENTION

The present technology may best be understood by referring to the following description and accompanying drawings that are used to illustrate embodiments of the present technology directed toward a magnetic field transducer mounting apparatus for Magnetic Tunnel Junction (MTJ) device testers, and testers for other similar magnetic devices fabricated on wafers.

In one embodiment, a magnetic field transducer mounting apparatus can include a first non-magnetic element and a second non-magnetic element. The first non-magnetic element can include a first mounting portion and a second mounting portion. The first mounting portion can be configured to fixedly couple the first non-magnetic element to a side surface of a wafer test fixture magnet. The non-magnetic element can also include a spacer portion configured to fixedly position the second mounting portion a predetermined distance from the first mounting portion adjacent the side surface of the wafer test fixture magnet. The second non-magnetic element can include one or more surfaces configured to couple to a magnetic field transducer. The second non-magnetic element can also include at third mounting portion configured to couple to the second mounting portion and adjustable position the magnetic field transducer in a predetermined position adjacent a face of the wafer test fixture magnet.

In another embodiment, a magnetic field transducer apparatus can include a first elongated portion including a first mount configured for fixedly coupling to a side surface of a wafer test fixture magnet. The apparatus can further include a second elongated portion including a second mount, and a third elongated portion including a third mount configured for coupling to the second mount. The third mount can also be configured for adjustable positioning a magnetic field transducer in a predetermined position adjacent a face of the wafer test fixture magnet. The second elongated portion can be disposed transverse to the first elongated portion in a first plane. The second elongated portion can also be disposed transverse to the third elongated portion in a second plane, wherein the first plane is transverse to the second plane.

In yet another embodiment, a method of controlling a magnetic field of a wafer test fixture magnet can include measuring a magnetic field generated by a wafer test fixture magnet during testing of a wafer of MTJ devices using a magnetic field transducer positioned, by a magnetic field transducer mounting apparatus, in a predetermined location adjacent a face of the wafer test fixture magnet. The magnetic field generated by the wafer test fixture magnet can be controlled based on the measurement of the magnetic field at the magnetic field transducer during the testing of the wafer of MTJ devices.

In one embodiment, the MTJ devices may be Spin Torque Magnetoresistive Random-Access Memory (ST-MRAM) devices. The wafer test fixture magnet may be an electromagnet used in an Automated Test Equipment (ATE) to re-orientate a magnetic field in one or more layers of the MTJ in one or more dies at a time on a wafer of ST-MRAM devices. The magnetic field transducer mounting apparatus can also be configured for use with other test fixtures for testing other magnetic devices fabricated on a wafer. The magnetic field transducer mounting apparatus can also be utilized for testing Giant Magnetoresistance (GMR) sensors, Anisotropic Magnetoresistance (AMR) sensor, Hall Effect sensors, and the like for use in Hard Disk Drives (HDD), magnetic field sensors and the like.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which:

FIG. 6 shows a flow diagram of using a magnetic field transducer mounting apparatus of a MTJ device test fixture to test MTJ Devices Under Test (DUTs), in accordance with embodiments of the present technology.

DETAILED DESCRIPTION OF THE INVENTION

Figure 1:
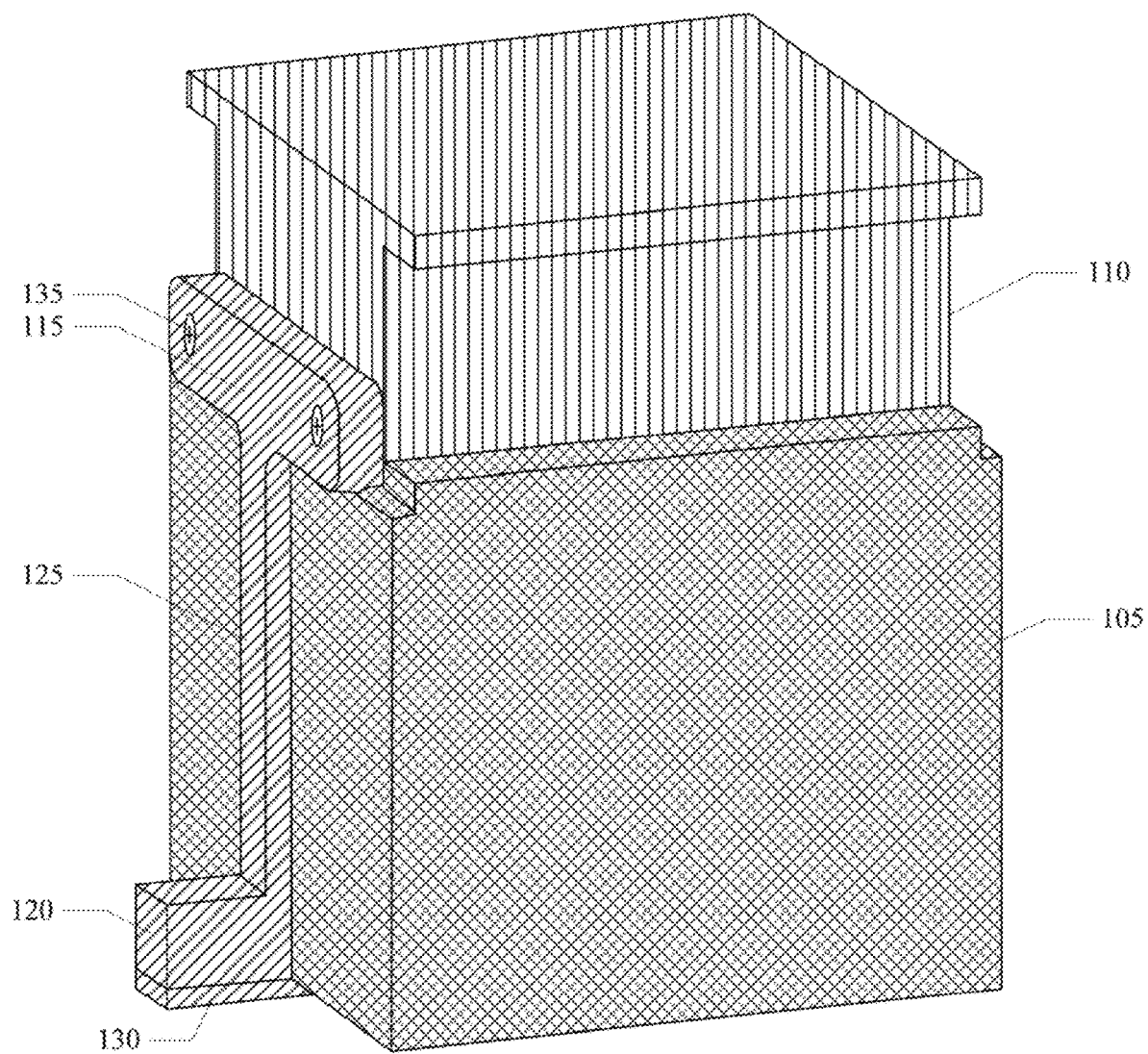
FIG. 1 shows a top-side view of a magnet assembly for a Magnetic Tunnel Junction (MTJ) device test fixture, in accordance with embodiments of the present technology.

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Referring to FIG. 1, a top-side view of a magnet assembly for a Magnetic Tunnel Junction (MTJ) device test fixture, in accordance with embodiments of the present technology, is shown. The assembly can include a wafer test fixture magnet 105, 110, a magnetic field transducer, and a mounting apparatus 115-130 for mounting the magnetic field transducer at a predetermined position adjacent a face of the magnet 105, 110. The magnet 105, 110, can be an electromagnet of a wafer test fixture. The face of the magnet 105, 110 refers to the surface that the magnetic flux field propagates out from and/or into. As illustrated in FIG. 1, the face of the magnet is the bottom surface of the magnet 105, 110 from which the magnetic flux field propagates out from toward a probe card and wafer. The wafer test fixture magnet 105, 110 can include a set of electromagnetic coils, core, cooling elements and enclosure thereof 105, and corresponding electrical connections, cooling connections and enclosure thereof 110. The magnetic field transducer can be configured to measure a magnetic field generated by the wafer test fixture magnet 105, 110.

In one aspect, the mounting apparatus 115-130 can include a first non-magnetic element 115-125 and a second non-magnetic element. The first non-magnetic element 115-125 can include a first mounting portion 115, a second mounting portion 120 and a spacer portion 125. The first mounting portion 115 can be configured to fixedly couple the first non-magnetic element 115-125 to a side surface of the wafer test fixture magnet 105, 110. In one example, the first mounting portion 115 can include a plurality of holes configured for fixedly coupling the first non-magnetic element 115-125 to the side surface of the wafer test fixture magnet 105, 110. In such an example, a plurality of non-magnetic screws 135, bolts, rivets or the like, configured to pass through respective ones of the plurality of holes of the first mounting portion 115, can be utilized to fixedly couple the first non-magnetic element 115-125 to the side surface of the wafer test fixture magnet 105, 110. In another example, the first mounting portion 115 can include a surface configured for fixedly coupling the first non-magnetic portion 115-125 to the side surface of the wafer test fixture magnet 105, 110 utilizing an adhesive. The above described fastening means for fixedly coupling the first non-magnetic element 115-125 to the wafer test fixture magnet 105, 110 is not intended to be limiting. Other means for fixedly coupling the first non-magnetic element 115-125 to the wafer test fixture magnet 105, 110 are also considered to be within the scope of the present technology.

In one aspect, the second non-magnetic element can include a surface configured to couple to the magnetic field transducer. The second non-magnetic element can also include a third mounting portion configured to couple to the second mounting portion 120 and adjustable position the magnetic field transducer in a predetermined position adjacent a face of the wafer test fixture magnet. In one example, the third mounting portion 130 can include a slot and the second mounting portion 120 can include a plurality of threaded holes. In such an example, a plurality of non-magnetic screws, bolts or the like, configured to pass through the slot of the third mounting portion 130 and into the threaded holes in the second mounting portion 120, can be utilized to couple the third mounting portion 130 to the second mounting portion 120 and adjustably position the magnetic field transducer in the predetermined position adjacent the face of the wafer test fixture magnet 105, 110. In another example, the second and third mounting portions 120, 130 can include mating dovetails, and the third mounting portion 130 can include a threaded hole. In such an example, a screw, bolt or the like, can be configured to pass through the hole in the mating dovetail of the third mounting portion 130 to frictionally engage the mating dovetail of the second mounting portion 120. The above described fastening means for adjustable coupling the third mounting portion 130 to the second mounting portion 120 is not intended to be limiting. Other means for adjustably coupling the third mounting portion 130 to the second mounting portion 120 are also considered to be within the scope of the present technology.

In one aspect, the one or more surfaces of the second non-magnetic element can be configured to couple to the magnetic field transducer. In one example, a surface disposed distally from the third mounting portion 130 and transverse to the face of the wafer test fixture magnet 105, 110 can be configured for fixedly coupling to the magnet field transducer utilizing an adhesive, one or more screw, one or more bolts or other similar fastening means. The first surface of the third mounting portion 130 can form a but joint with a corresponding surface of the magnetic field transducer. In another example, a first surface disposed distally from the third mounting portion 130 and transverse to the face of the wafer test fixture magnet 105, 110 can be configured to abut the magnetic field transducer. A second surface adjacent to the first surface can be configured for fixedly couple to the magnetic field transducer utilizing an adhesive, one or more screws, one or more bolts or other similar fastening means. The first and second surface of the third mounting portion 130 can form a half-lap joint with corresponding surfaces of the magnetic field transducer. In yet another example, a surface of the second non-magnetic element can include a transducer receptacle distally disposed from the third mounting portion 130. The transducer receptacle can be configured to contain the magnetic field transducer. The transducer receptacle can extend partially into the surface of the second non-magnetic element or can extend through the second non-magnetic element. If the transducer receptacle extends partially into a top surface of the second non-magnetic element that mates to the face of the wafer test fixture magnet 105, 110, an aperture may extend from the transducer receptacle through the second non-magnetic element to route one or more electrical connections of the magnetic field transducer out of the receptacle. The above described fastening means for fixedly coupling the magnetic field transducer to the second non-magnetic element is not intended to be limiting. Other means for coupling the magnetic field transducer to the second non-magnetic element are also considered to be within the scope of the present technology.

Figure 2:
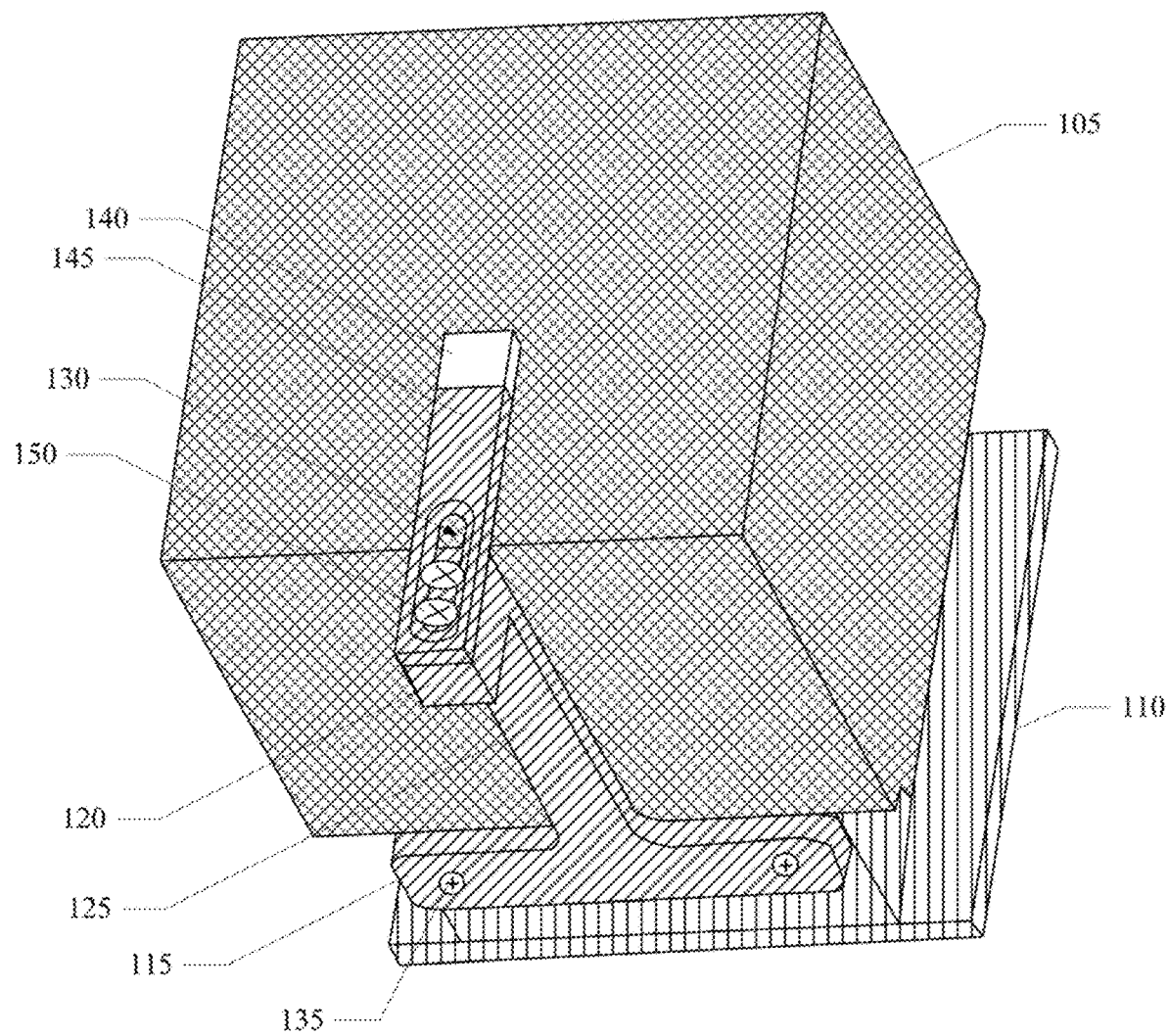
FIG. 2 shows a bottom-side view of a magnet assembly for a MTJ device test fixture, in accordance with embodiments of the present technology.

Referring now to FIG. 2, a bottom-side view of a magnet assembly for a MTJ device test fixture, in accordance with embodiments of the present technology, is shown. Again, the assembly can include a wafer test fixture magnet 105, 110, a magnetic field transducer 140, and a mounting apparatus 115-130, 145 for mounting the magnetic field transducer 140 at a predetermined position adjacent a face of the magnet 105, 110.

In one aspect, the mounting apparatus 115-130, 145 can include a first non-magnetic element 115-125 and a second non-magnetic element 130, 140. The first non-magnetic element 115-125 can include a first mounting portion 115, a second mounting portion 120 and a spacer portion 125. The first mounting portion 115 can be configured to fixedly couple the first non-magnetic element 115-125 to a side surface of the wafer test fixture magnet 105, 110. In one example, the first mounting portion 115 can include a plurality of holes configured for fixedly coupling the first non-magnetic portion to the side surface of the wafer test fixture magnet 105, 110. In such an example, a plurality of non-magnetic screws 135, bolts, rivets or the like, configured to pass through respective ones of the plurality of holes of the first mounting portion 115, can be utilized to fixedly couple the first non-magnetic element 115-125 to the side surface of the wafer test fixture magnet 105, 110. In another example, the first mounting portion 115 can include a surface configured for fixedly coupling the first non-magnetic portion 115-125 to the side surface of the wafer test fixture magnet 105, 110 utilizing an adhesive. The above described fastening means for fixedly coupling the first mounting portion 115 to the wafer test fixture magnet 105, 110 is not intended to be limiting. Other means for fixedly coupling the first mounting portion to the wafer test fixture magnet 105, 110 are also considered to be within the scope of the present technology.

In one aspect, the second non-magnetic element 130, 145 can include a surface 145 configured to couple to the magnetic field transducer 140. The second non-magnetic element 130, 145 can also include a third mounting portion 130 configured to couple to the second mounting portion 120 and adjustable position the magnetic field transducer 140 in a predetermined position adjacent a face of the wafer test fixture magnet 105, 110. In one example, the third mounting portion 130 can include a slot and the second mounting portion 120 can include a plurality of threaded holes. In such an example, a plurality of non-magnetic screws, bolts or the like, configured to pass through the slot of the third mounting portion 130 and into the threaded holes in the second mounting portion 120, can be utilized to couple the third mounting portion 130 to the second mounting portion 120 and adjustably position the magnetic field transducer 140 in the predetermined position adjacent the face of the wafer test fixture magnet 105, 110. In another example, the second and third mounting portions 120, 130 can include mating dovetails, and the third mounting portion 130 can include a threaded hole. In such an example, a screw, bolt or the like, can be configured to pass through the hole in the mating dovetail of the third mounting portion 130 to frictionally engage the mating dovetail of the second mounting portion 120. The above described fastening means for adjustable coupling the third mounting portion 130 to the second mounting portion 120 is not intended to be limiting. Other means for adjustably coupling the third mounting portion 130 to the second mounting portion 120 are also considered to be within the scope of the present technology.

In one aspect, the one or more surfaces 145 of the second non-magnetic element can be configured to couple to the magnetic field transducer 140. In one example, a surface disposed distally from the third mounting portion 130 and transverse to the face of the wafer test fixture magnet 105, 110 can be configured for fixedly coupling to the magnet field transducer 140 utilizing an adhesive, one or more screw, one or more bolts or other similar fastening means. The first surface of the third mounting portion 130 can form a butt joint with a corresponding surface of the magnetic field transducer. In another example, a first surface disposed distally from the third mounting portion 130 and transverse to the face of the wafer test fixture magnet 105, 110 can be configured to abut the magnetic field transducer. A second surface adjacent to the first surface can be configured for fixedly coupling to the magnetic field transducer utilizing an adhesive, one or more screw, one or more bolts or other similar fastening means. The first and second surface of the third mounting portion 130 can form a half-lap joint with corresponding surfaces of the magnetic field transducer 105, 110. In yet another example, a surface of the second non-magnetic element 130, 145 can include a transducer receptacle distally disposed from the third mounting portion 130. The transducer receptacle can be configured to contain the magnetic field transducer 140. The transducer receptacle can extend partially into the surface of the second non-magnetic element 130, 145 or can extend through the second non-magnetic element 130, 145. If the transducer receptacle extends partially into a top surface of the second non-magnetic element 130, 145 that mates to the face of the wafer test fixture magnet 105, 110, an aperture may extend from the transducer receptacle through the second non-magnetic element 130, 145 to route one or more electrical connections of the magnetic field transducer 140 out of the receptacle. The above described fastening means for fixedly coupling the magnetic field transducer 140 to the second non-magnetic element 130, 145 is not intended to be limiting. Other means for coupling the magnetic field transducer 140 to the second non-magnetic element 130, 145 are also considered to be within the scope of the present technology.

Figure 3:
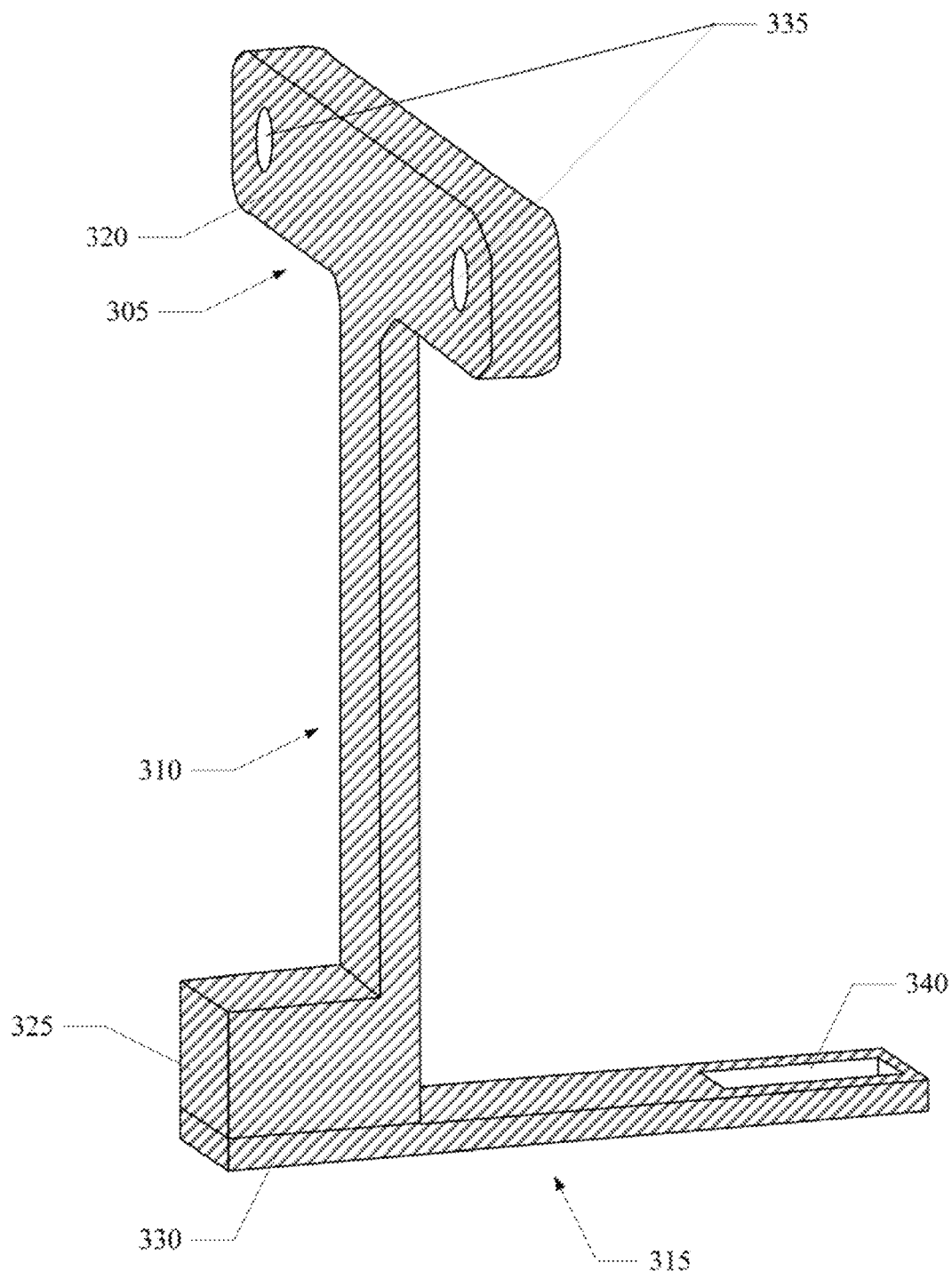
FIG. 3 shows a side view of a magnetic field transducer mounting apparatus, in accordance with embodiments of the present technology.

Referring now to FIG. 3, a side view of a magnetic field transducer mounting apparatus, in accordance with embodiments of the present technology, is shown. The magnetic field transducer mounting apparatus can include a first elongated portion 305, a second elongated portion 310 and a third elongated portion 315. The first elongated portion 305 can include a first mount 315 configured to fixedly couple to a side surface of a wafer test fixture magnet. The second elongated portion 310 can include a second mount 325. The third elongated portion 315 including a third mount 330 configured to couple to the second mount 325 and adjustably position a magnetic field transducer in a predetermined position adjacent a face of the wafer test fixture magnet. The second elongated portion 310 can be disposed transverse to the first elongated portion 305 in a first plane. The second elongated portion 310 can also be disposed transverse to the third elongated portion 315 in a second plane, wherein the first plane is transverse to the second plane. In one implementation, the first, second and third elongated portions 305-315 can be non-magnetic portions of the magnetic field transducer mounting apparatus. In one implementation, the first and second elongated portions 305, 310 can comprise a first element of the magnetic field transducer mounting apparatus, and the third elongated portion 315 can comprise a second element of the magnetic field transducer mounting apparatus.

In one example, the first mount 320 can include a plurality of holes 335 disposed along a length of the first elongated portion 305 configured for fixedly coupling to the side surface of the wafer test fixture magnet. In such an example, a plurality of non-magnetic fasteners can be configured to pass through respective ones of the plurality of holes 335 of the first mount 320 for fixedly coupling the first elongated portion 305 to the side surface of the wafer test fixture magnet. In another example, the first mount 320 can include a surface configured for fixedly coupling the first elongated portion 305 to the side surface of the wafer test fixture magnet utilizing an adhesive. The above described fastening means for fixedly coupling to the wafer test fixture magnet is not intended to be limiting. Other means for fixedly coupling to the wafer test fixture magnet are also considered to be within the scope of the present technology.

In one example, the third mount 330 can include a slot and the second mount 325 can include a plurality of threaded holes. In such an example, a plurality of non-magnetic threaded fasteners can be configured to pass through the slot of the third mount 330 and threadedly engage the threaded holes of the second mount 325 to couple the third mount 330 to the second mount 325 and adjustably position the magnetic field transducer in the predetermined position adjacent the face of the wafer test fixture magnet. In another example, the third mount 330 can include a first one of a mating pair of dovetails, a threaded hole through the first one of the mating pair of dovetails, and a threaded fastener configured to threadedly engage the threaded hole through the first one of the mating pair of dovetails. The second mount 325 can include a second one of the mating pair of dovetails. In such an example, the mating pair of dovetails and the threaded fastener are configured for coupling the third mount 330 to the second mount 325 and adjustably position the magnetic field transducer in the predetermined position adjacent the face of the wafer test fixture magnet. The above described fastening means for adjustable coupling the third mount 330 to the second mount 325 is not intended to be limiting. Other means for adjustably coupling the third mount 330 to the second mount 325 are also considered to be within the scope of the present technology.

In one example, the third elongated portion 315 can include a surface distal from the third mount 330 and transverse to the face of the wafer test fixture magnet and configured for fixedly coupling to the magnetic field transducer. The magnetic field transducer can be fixedly coupled to the distal surface utilizing an adhesive, one or more screw, one or more bolts or other similar fastening means. The first surface of the third mount 330 can form a butt joint with a corresponding surface of the magnetic field transducer. In another example, the third elongated portion 315 can include a first surface distal from the third mount 330 and transverse to the face of the wafer test fixture magnet configured for coupling to the magnetic field transducer. The third elongated portion 315 can also include a second surface adjacent the first surface and configured for fixedly coupling to the magnetic field transducer. In such an example, the magnetic field transducer can abut the first surface and fixedly coupled to the second surface utilizing an adhesive, one or more screw, one or more bolts or other similar fastening means. The first and second surface of the third elongated portion 315 can form a half-lap joint with corresponding surfaces of the magnetic field transducer. In another example, the third elongated portion 315 can include a transducer receptacle 340 distal from the third mount 330 and configured to contain the magnetic field transducer. If the transducer receptacle 340 extends through the third elongated portion 315, an aperture extending from the transducer receptacle 340 through the third elongated portion 315 can be included for routing an electrical connection of the magnetic field transducer through the third elongated portion 325. The above described fastening means for fixedly coupling the magnetic field transducer to the third elongated portion 315 is not intended to be limiting. Other means for coupling the magnetic field transducer to the third elongated portion 315 are also considered to be within the scope of the present technology.

Figure 4:
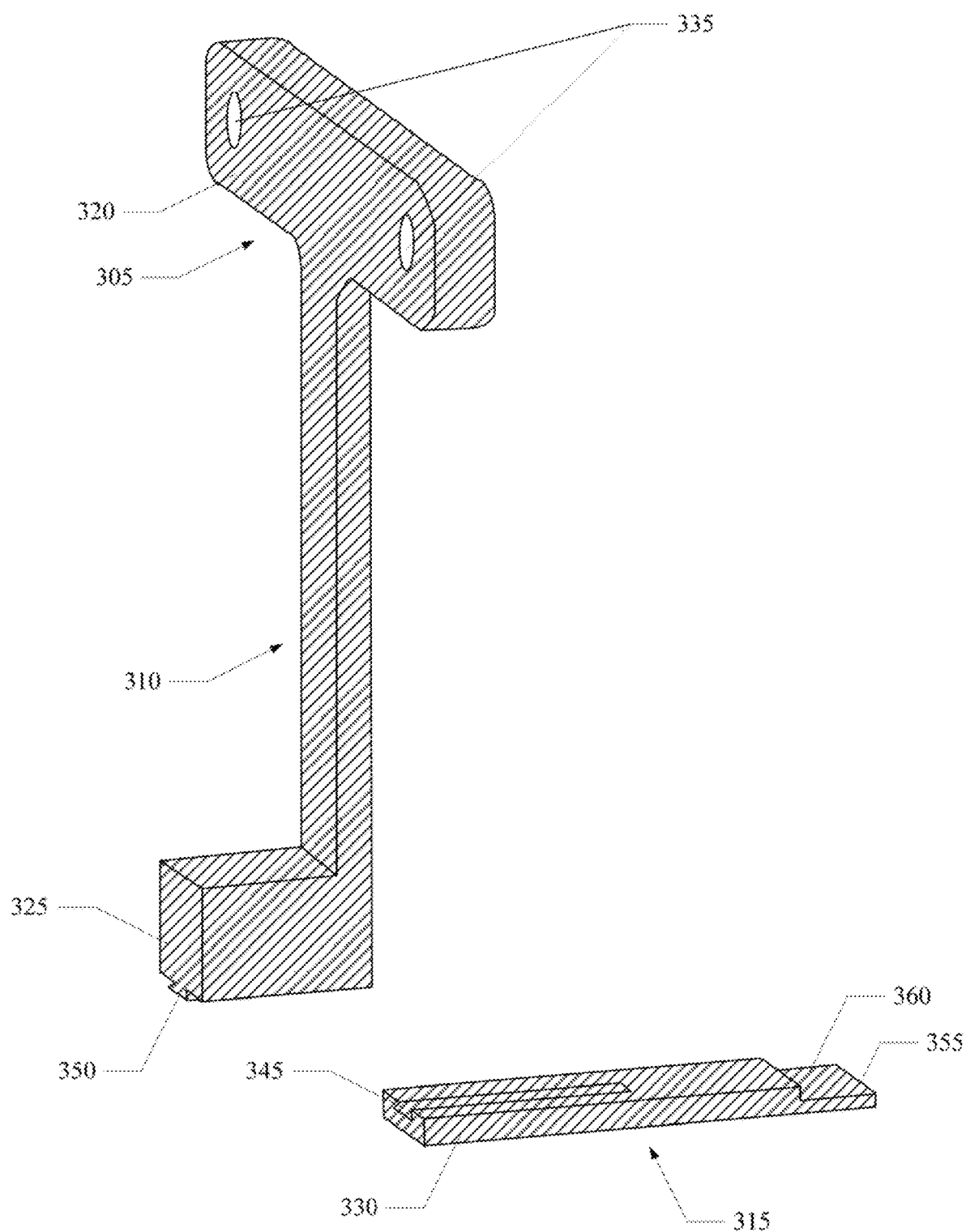
FIG. 4 shows a side view of a magnetic field transducer mounting apparatus, in accordance with embodiments of the present technology.

FIG. 4 shows a side view of a magnetic field transducer mounting apparatus, in accordance with embodiments of the present technology, is shown. Again, the magnetic field transducer mounting apparatus can include a first elongated portion 305, a second elongated portion 310, and a third elongated portion 315. The first elongated portion 305 can include a first mount 320 configured to fixedly couple to a side surface of a wafer test fixture magnet. The second elongated portion 310 can include a second mount 325. The third elongated portion 325 can include a third mount 330 configured to couple to the second mount 325 and adjustably position a magnetic field transducer in a predetermined position adjacent a face of the wafer test fixture magnet. The second elongated portion 310 can be disposed transverse to the first elongated portion 305 in a first plane. The second elongated portion 310 can also be disposed transverse to the third elongated portion 315 in a second plane, wherein the first plane is transverse to the second plane. In one implementation, the first, second and third elongated portions 305-315 can be non-magnetic portions of the magnetic field transducer mounting apparatus. In one implementation, the first and second elongated portions 305, 310 can comprise a first element of the magnetic field transducer mounting apparatus, and the third elongated portion 315 can comprise a second element of the magnetic field transducer mounting apparatus.

In one example, the first mount 320 can include a plurality of holes 335 disposed along a length of the first elongated portion 305 configured for fixedly coupling to the side surface of the wafer test fixture magnet. In such an example, a plurality of non-magnetic fasteners can be configured to pass through respective ones of the plurality of holes 335 of the first mount 310 for fixedly coupling the first elongated portion 305 to the side surface of the wafer test fixture magnet. In another example, the first mount 320 can include a surface configured for fixedly coupling to the side surface of the wafer test fixture magnet utilizing an adhesive. The above described fastening means for fixedly coupling to the wafer test fixture magnet is not intended to be limiting. Other means for fixedly coupling to the wafer test fixture magnet are also considered to be within the scope of the present technology.

In one example, the third mount 330 can include a slot and the second mount 325 can include a plurality of threaded holes. In such an example, a plurality of non-magnetic threaded fasteners can be configured to pass through the slot of the third mount 330 and threadedly engage the threaded holes of the second mount 325 to couple the third mount 330 to the second mount 325 and adjustably position the magnetic field transducer in the predetermined position adjacent the face of the wafer test fixture magnet. In another example, the third mount 330 can include a first one of a mating pair of dovetails 345, a threaded hole through the first one of the mating pair of dovetails, and a threaded fastener configured to threadedly engage the threaded hole through the first one of the mating pair of dovetails. The second mount 325 can include a second one of the mating pair of dovetails 350. In such an example, the mating pair of dovetails 345, 350 and the threaded fastener are configured for coupling the third mount 330 to the second mount 325 and adjustably position the magnetic field transducer in the predetermined position adjacent the face of the wafer test fixture magnet. The above described fastening means for adjustable coupling the third mount 330 to the second mount 325 is not intended to be limiting. Other means for adjustably coupling the third mount 330 to the second mount 325 are also considered to be within the scope of the present technology.

In one example, the third elongated portion 315 can include a surface distal from the third mount 330 and transverse to the face of the wafer test fixture magnet and configured for fixedly coupling to the magnetic field transducer. The magnetic field transducer can be fixedly coupled to the distal surface utilizing an adhesive, one or more screw, one or more bolts or other similar fastening means. The first surface of the third mount 330 can form a butt joint with a corresponding surface of the magnetic field transducer. In another example, the third elongated portion 315 can include a first surface 355 distal from the third mount 330 and transverse to the face of the wafer test fixture magnet configured for coupling to the magnetic field transducer. The third elongated portion 315 can also include a second surface 360 adjacent the first surface and configured for fixedly coupling to the magnetic field transducer. In such an example, the magnetic field transducer can abut the first surface 355 and fixedly coupled to the second surface 360 utilizing an adhesive, one or more screw, one or more bolts or other similar fastening means. The first and second surfaces 355, 360 of the third elongated portion 315 can form a half-lap joint with corresponding surface 2 of the magnetic field transducer. In another example, the third elongated portion 315 can include a transducer receptacle distal from the third mount 330 and configured to contain the magnetic field transducer. If the transducer receptacle extends through the third elongated portion 315, an aperture extending from the transducer receptacle through the third elongated portion 315 can be included for routing an electrical connection of the magnetic field transducer through the third elongated portion 315. The above described fastening means for fixedly coupling the magnetic field transducer to the third elongated portion 315 is not intended to be limiting. Other means for coupling the magnetic field transducer to the third elongated portion 315 are also considered to be within the scope of the present technology.

Figure 5:
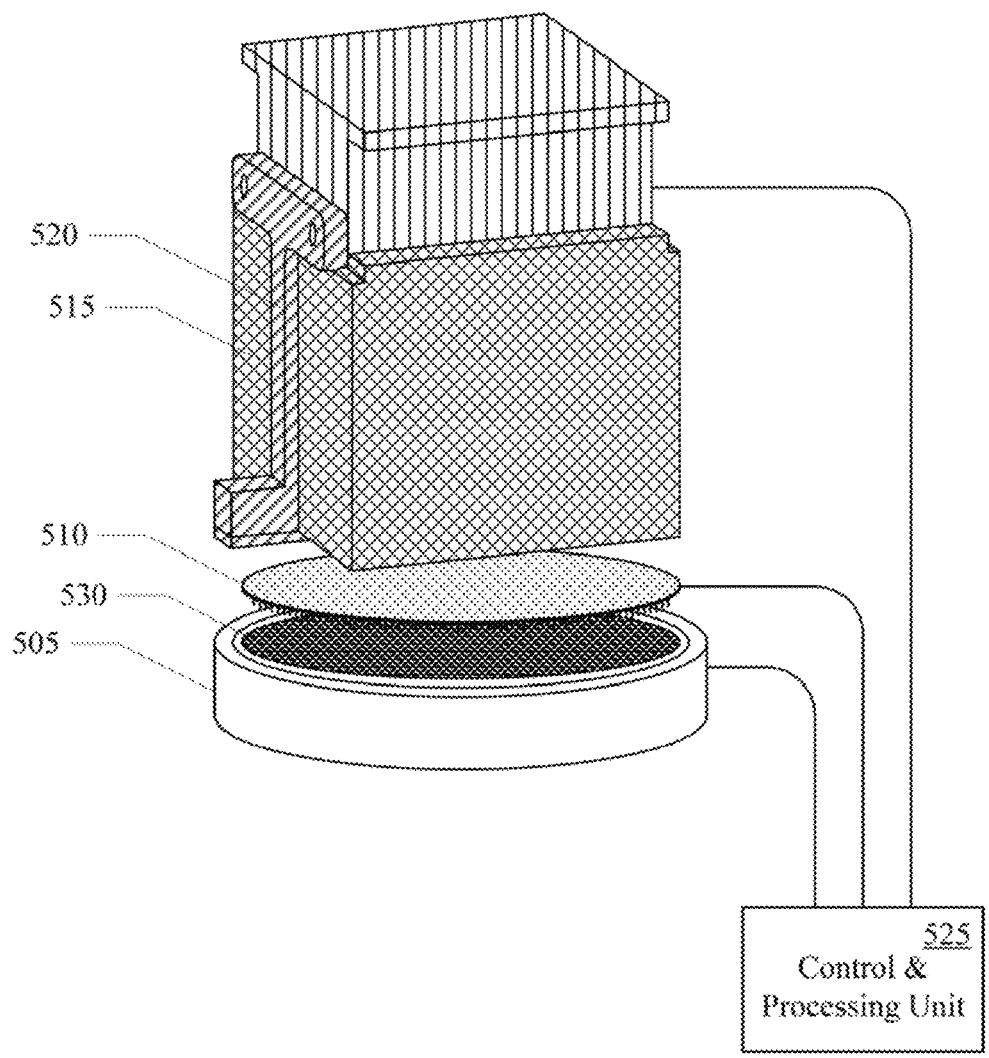
FIG. 5 shows a side view of a MTJ device test fixture, in accordance with embodiments of the present technology.

Referring now to FIG. 5, a side view of a MTJ device test fixture, in accordance with embodiments of the present technology, is shown. The MTJ device text fixture can include a wafer chuck 505, a probe card 510, a wafer test fixture magnet 515, a magnetic field transducer mounting apparatus 520, a first magnetic field transducer, and a control unit 525. The MTJ device test fixture may include numerous other elements common to conventional Automatic Test Equipment (ATE). However, such elements are not germane to an understanding of embodiments of the present technology, and therefore will not be further described herein.

The wafer chuck 505 can be configured to hold a wafer 530 upon which a plurality of MTJ devices are fabricated. The probe card 510 can be configured to make electrical connection to one or more of the plurality of MTJ devices on the wafer 530 for testing by the control and process unit 525. The wafer test fixture magnet 515 can be configured to create a magnetic field proximate one or more of the plurality of MTJ devices.

In one aspect, the magnetic field transducer mounting apparatus 520 can be configured to fixedly coupled to a side surface of the wafer test fixture magnet 515 and adjustably position a first magnetic field transducer in a predetermined position adjacent a face of the wafer test fixture magnet 515. As described above, the magnetic field transducer mounting apparatus 520 can include a first non-magnetic element and a second non-magnetic element. The first non-magnetic element can include a first mounting portion configured to fixedly coupled the first non-magnetic element to a side surface of the wafer test fixture magnet. The first non-magnetic element can also include a second mounting portion and a spacer portion. The spacer portion can be configured to fixedly position the second mounting portion a predetermined distance from the first mounting portion adjacent the side surface of the wafer test fixture magnet. The second non-magnetic element can include one or more surfaces configured to couple to the first magnetic field transducer. The second non-magnetic element can also include a third mounting portion configured to couple to the second mounting portion and adjustable position the first magnetic field transducer in a predetermined location adjacent a face of the wafer test fixture magnet.

In one aspect, the magnetic field created by the wafer test fixture magnet 515 can be utilized to re-orientate a magnetic field in one or more layers of the MTJ devices during testing. The field generated by the magnet can be measured by the magnetic field transducer at the predetermined location adjacent the face of the wafer test fixture magnet. The measurement of the magnetic field can be utilized to control, through a feedback loop, the magnetic field generated by the wafer test fixture magnet. Additional control of the magnetic field generated by the wafer test fixture magnet can be achieved as will be further described with reference to FIG. 6.

Referring now to FIG. 6, a flow diagram of using a magnetic field transducer mounting apparatus of a MTJ device test fixture to test MTJ Devices Under Test (DUTs), in accordance with embodiments of the present technology, is shown. The method may be implemented as computing device-executable instructions (e.g., computer program) that are stored in computing device-readable media (e.g., computer memory) and executed by a computing device (e.g., processor). Testing of MTJ DUTs using the MTJ device test fixture 500 can include a calibration phase 610-630 and a testing phase 640, 650.

In the calibration phase, a set of one or more magnetic fields generated by the wafer test fixture magnet 515 can be measured by the first magnetic field transducer positioned by the magnetic field transducer mounting apparatus 520, at 610. The magnetic field transducer mounting apparatus 520 can be configured to position the first magnetic field transducer in a predetermined location adjacent the face of the wafer test fixture magnet 515. During the calibration phase a second magnetic field transducer can be placed on the wafer chuck 505, in place of a wafer 530. At 620, a second measurement of the set of one or more magnetic fields generated by the wafer test fixture magnet 515 can be made by the second magnetic field transducer position on the wafer chuck. At 630, the set of one or more magnetic fields measured at the face of the wafer test fixture magnet 515 can be correlated to the set of one or more magnetic fields measured at the wafer chuck. In one instance, the correlation can be saved in a calibration table.

In the testing phase, a magnetic field generated by the wafer test fixture magnet 515 can be measured using the first magnetic field transducer positioned, by the magnetic field transducer mounting apparatus 520, in the predetermined location adjacent the face of the wafer test fixture magnet 515, at 640. At 650, the magnetic field generated by the wafer test fixture magnet 515 at a predetermined location on a wafer 530 can be controlled based on the measurement of the magnetic field at the first magnetic field transducer and the correlation between the set of one or more magnetic fields measured at the face of the wafer test fixture magnet and at the wafer chuck. The processes of 640 and 650 can be repeated for each magnetic field generated by the wafer test fixture magnet during testing of the MTJ DT.

Embodiments of the present technology advantageously provide for coupling a magnetic field transducer in a predetermined position adjacent a face of a wafer test fixture magnet by a magnetic field transducer mounting apparatus. The magnetic field transducer mounting apparatus can advantageously be utilized for accurate measurement of the magnetic field generated by the wafer test fixture magnet during testing of MTJ devices such as Spin Torque Magnetoresistive Random-Access Memory (ST-MRMA). The magnetic field transducer mounting apparatus can also be configured for use with other test fixtures for testing other magnetic devices fabricated on a wafer. The magnetic field transducer mounting apparatus can also be utilized for testing Giant Magnetoresistance (GMR) sensors, Anisotropic Magnetoresistance (AMR) sensor, Hall Effect sensors, and the like for use in Hard Disk Drives (HDD), magnetic field sensors and the like.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A method of controlling a magnetic field of a wafer test fixture magnet comprising:
  measuring a magnetic field generated by the wafer test fixture magnet during testing of a wafer of Magnetoresistive Tunnel Junction (MTJ) devices using a first magnetic field transducer positioned, by a magnetic field transducer mounting apparatus, in a predetermined location adjacent a face of the wafer test fixture magnet; and
  controlling the magnetic field generated by the wafer test fixture magnet based on the measurement of the magnetic field at the first magnetic field transducer during the testing of the wafer of MTJ devices.

2. The method according to claim 1, further comprising:
  measuring a set of one or more magnetic fields generated by a wafer test fixture magnet using the first magnetic field transducer positioned, by the magnetic field transducer mounting apparatus, in the predetermined location adjacent the face of the wafer test fixture magnet;
  measuring the set of one or more magnetic fields generated by the wafer test fixture magnet using a second magnetic field transducer positioned proximate a wafer chuck where the wafer of MTJ devices are positioned during testing;

correlating the set of one or more magnetic fields measured at the face of the wafer test fixture magnet to the set of one or more magnetic fields measure at the wafer check; and controlling the magnetic field generated by the wafer test fixture magnet further based on the measurement of the magnetic field at the first magnetic field transducer and the correlation between the set of one or more magnetic fields measured at the wafer test fixture magnet to the set of one or more magnetic fields measure at the wafer chuck during the testing of the wafer of MTJ devices.

3. The method according to claim 1, wherein, the wafer test fixture magnet comprises an electromagnet; and the wafer of MTJ device comprises a wafer of Spin Torque Magnetoresistive Random-Access Memory (ST-MRAM) devices.

4. The method according to claim 1, further comprising:

fixedly coupling a first mounting portion of a first non-magnetic element of the magnetic field transducer mounting apparatus to a side surface of the wafer test fixture magnet;

wherein a spacer portion of the first non-magnetic element fixedly positions a second mounting portion of the first non-magnetic element a predetermined distance from the first mounting portion adjacent a side surface of the wafer test fixture magnet;

coupling the magnetic field transducer to one or more surfaces of a second non-magnetic element; and coupling a third mounting port of the second non-magnetic element to the second mounting portion; and adjustably positioning the magnetic field transducer in a predetermined position adjacent a face of the wafer test fixture magnet.

5. A method comprising:

fixedly coupling a first mount of a first elongated portion of a magnetic transducer mounting apparatus to a side surface of a wafer test fixture magnet;

coupling a second mount of a second elongated portion of the magnetic transducer mounting apparatus to a third mount of a third elongated portion of the magnetic transducer mounting apparatus, wherein the second elongated portion is disposed transverse to the first elongated portion in a first plane, and the second elongated portion is disposed transverse to the third elongated portion in a second plane, wherein the first plane is transverse to the second plane;

adjusting the second and third mount to position a magnetic field transducer in a predetermined position adjacent a face of the wafer test fixture magnet;

measuring a magnetic field generated by the wafer test fixture magnet during testing of a wafer of Magnetoresistive Tunnel Junction (MTJ) devices using the first magnetic field transducer positioned, by the magnetic field transducer mounting apparatus; and controlling the magnetic field generated by the wafer test fixture magnet based on the measurement of the magnetic field at the first magnetic field transducer during the testing of the wafer of MTJ devices.

6. The method according to claim 5, wherein fixedly coupling the first mounting portion of the first non-magnetic element to the side surface of the wafer test fixture includes:

engaging a plurality of fasteners passing through respective ones of a plurality of holes of the first mount with a side surface of the wafer test fixture.

7. The method of claim 5, wherein coupling the second mount of a second elongated portion to the third mount of a third elongated portion and adjusting the second and third mount to position the magnetic field transducer in a predetermined position comprises:

engaging a plurality of threaded fasteners passing through a slot of the third mound in threaded holes in the second mount.

8. The method according to claim 5, wherein coupling the second mount of a second elongated portion to the third mount of a third elongated portion and adjusting the second and third mount to position the magnetic field transducer in a predetermined position comprises matting a first one of a dovetail on the third mount to a second one of a dovetail on the second mount; and engaging a threaded fastener through a threaded hole in the first dovetail of the third mount to the second mount.

9. The method according to claim 5, further comprising:

fixedly coupling the magnetic field transducer to a surface of the third elongated portion distal from the third mount and transverse to the face of the wafer test fixture magnet.

10. The method according to claim 5, wherein, the wafer test fixture magnet comprises an electromagnet; and the wafer of MTJ device comprises a wafer of Spin Torque Magnetoresistive Random-Access Memory (ST-MRAM) devices.

\* \* \* \* \*